United States Patent
Imaizumi et al.

(10) Patent No.: US 9,658,529 B2
(45) Date of Patent: *May 23, 2017

(54) PHOTOSENSITIVE RESIN COMPOSITION, RESIST LAMINATE, AND CURED PRODUCT THEREOF (2)

(71) Applicant: Nippon Kayaku Kabushiki Kaisha, Tokyo (JP)

(72) Inventors: Naoko Imaizumi, Tokyo (JP); Shinya Inagaki, Tokyo (JP); Nao Honda, Tokyo (JP)

(73) Assignee: Nippon Kayaku Kabushiki Kaisha, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/437,940

(22) PCT Filed: Oct. 25, 2013

(86) PCT No.: PCT/JP2013/078936
§ 371 (c)(1),
(2) Date: Apr. 23, 2015

(87) PCT Pub. No.: WO2014/065394
PCT Pub. Date: May 1, 2014

(65) Prior Publication Data
US 2015/0301450 A1    Oct. 22, 2015

(30) Foreign Application Priority Data

Oct. 26, 2012  (JP) .................. 2012-236749

(51) Int. Cl.
*G03F 7/038*  (2006.01)
*G03F 7/075*  (2006.01)

(52) U.S. Cl.
CPC ............ *G03F 7/0751* (2013.01); *G03F 7/038* (2013.01); *G03F 7/0755* (2013.01)

(58) Field of Classification Search
CPC ..................... C08G 59/621; G03F 7/0751
See application file for complete search history.

(56) References Cited

U.S. PATENT DOCUMENTS

| | | | |
|---|---|---|---|
| 4,256,828 A | 3/1981 | Smith | |
| 4,882,245 A | 11/1989 | Gelorme et al. | |
| 6,127,085 A | 10/2000 | Yamamura et al. | |
| 9,448,479 B2 | 9/2016 | Imaizumi et al. | |
| 2003/0220455 A1 | 11/2003 | Ichiroku et al. | |
| 2013/0108961 A1 | 5/2013 | Oonishi et al. | |
| 2015/0293444 A1 | 10/2015 | Imaizumi et al. | |
| 2015/0293448 A1 | 10/2015 | Imaizumi et al. | |
| 2015/0309409 A1 | 10/2015 | Imaizumi et al. | |

FOREIGN PATENT DOCUMENTS

| | | |
|---|---|---|
| JP | 3-17117 A | 1/1991 |
| JP | 9-255765 A | 9/1997 |
| JP | 10-168165 A | 6/1998 |
| JP | 2000-44776 A | 2/2000 |
| JP | 2001-164094 A | 6/2001 |
| JP | 2006-169326 A | 6/2006 |
| JP | 2008-20838 A | 1/2008 |
| JP | 2008-20839 A | 1/2008 |

(Continued)

OTHER PUBLICATIONS

International Search Report/Written Opinion mailed Nov. 19, 2013 in co-pending PCT application No. PCT/JP2013/078933.

(Continued)

*Primary Examiner* — Cynthia Hamilton
(74) *Attorney, Agent, or Firm* — Nields, Lemack & Frame, LLC

(57) ABSTRACT

The purpose of the present invention is to provide: a photosensitive epoxy resin composition and/or a resist laminate of said resin composition that makes it possible to use photolithography to form an image having a vertical sidewall shape and fine resolution, low stress, and heat/humidity resistance; and a cured product of said resin composition and said resist laminate. The present invention is a photosensitive resin composition comprising: (A) an epoxy resin; (B) a polyphenol compound having a specific structure; (C) a photocationic polymerization initiator; and (D) an epoxy group-containing silane compound. The epoxy resin (A) comprises: an epoxy resin (a) obtained by reacting a phenol derivative that is represented by formula (1) with an epihalohydrin; and an epoxy resin (b) that is represented by formula (2).

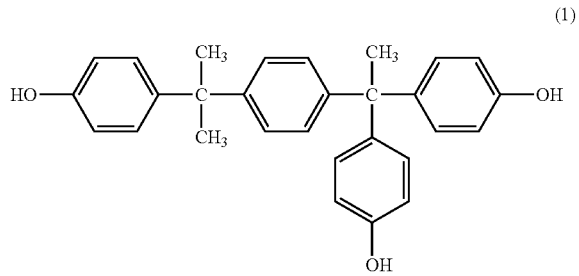

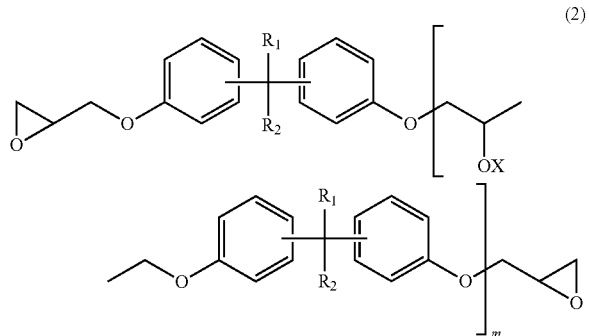

9 Claims, No Drawings

(56) References Cited

FOREIGN PATENT DOCUMENTS

| | | | |
|---|---|---|---|
| JP | 2008-26667 A | 2/2008 |
| JP | 2009-263544 A | 11/2009 |
| JP | 2009-265449 A | 11/2009 |
| JP | 2010-24364 A | 2/2010 |
| JP | 2010-271401 A | 12/2010 |
| JP | 2010-276694 A | 12/2010 |
| TW | 2009-48920 A | 12/2009 |
| WO | 2009/151050 A1 | 12/2009 |
| WO | 2010/001919 A1 | 1/2010 |
| WO | 2012/008472 A1 | 1/2012 |
| WO | 2013/036502 A1 | 3/2013 |
| WO | WO 2013/134104 A2 * | 9/2013 |
| WO | WO 2014/080975 A1 * | 5/2014 |
| WO | WO 2014/080976 A1 * | 5/2014 |
| WO | WO 2014/080977 A1 * | 5/2014 |

OTHER PUBLICATIONS

International Preliminary Report on Patentability mailed May 7, 2015 in co-pending PCT application No. PCT/JP2013/078933.
International Search Report/Written Opinion mailed Nov. 19, 2013 in corresponding PCT application No. PCT/JP2013/078936.
International Preliminary Report on Patentability mailed May 7, 2015 in corresponding PCT application No. PCT/JP2013/078936.
International Search Report/Written Opinion mailed Dec. 17, 2013 in co-pending PCT application No. PCT/JP2013/081354.
International Preliminary Report on Patentability mailed Jun. 4, 2015 in co-pending PCT application No. PCT/JP2013/081354.
International Search Report/Written Opinion mailed Dec. 17, 2013 in co-pending PCT application No. PCT/JP2013/081358.
International Preliminary Report on Patentability mailed Jun. 4, 2015 in co-pending PCT application No. PCT/JP2013/081358.
Proc. SPIE, vol. 2438, pp. 846-852, 1995, "High Aspect Ratio Resist for Thick Film Applications", LaBianca, et al.
European communication dated May 9, 2016 in corresponding European patent application No. 13849046.1.
Office action mailed Apr. 6, 2016 in co-pending U.S. Appl. No. 14/443,679.
European communication dated Jul. 22, 2016 in co-pending European patent application No. 13856834.0.
Notice of Allowance mailed Jun. 21, 2016 in co-pending U.S. Appl. No. 14/443,679.
PLACCEL 308 flyer, Daicel Corporation, No Date Given.
Office action mailed Nov. 9, 2016 in co-pending U.S. Appl. No. 14/443,669.
European communication dated Jan. 30, 2017 in co-pending European patent application No. 13849119.6.
Taiwanese communication, with English translation, dated Jan. 16, 2017 in co-pending Taiwanese patent application No. 102142468.

* cited by examiner

PHOTOSENSITIVE RESIN COMPOSITION, RESIST LAMINATE, AND CURED PRODUCT THEREOF (2)

TECHNICAL FIELD

The present invention relates to a photosensitive resin composition which enables an image having a good sidewall profile and excellent resolution to be formed, having excellent adhesion to a substrate when subjected to a test for humidity and heat due to a small internal stress after curing; and relates to a cured product thereof. A cured product of the photosensitive resin composition according to the present invention is useful in manufacturing of an MEMS (microelectromechanical system) component, a μ-TAS (micro total analysis system) component, a microreactor component, and an insulating layer of electronic components such as a capacitor and an inductor, an LIGA component, a mold and a stamp for microinjection and thermal embossing, a screen or a stencil for microprinting application, a packaging component for MEMS and semiconductors, a BioMEMS and a biophotonic device, and a printed circuit board.

BACKGROUND ART

Among photosensitive resin compositions, ones to which photolithography is applicable are called photoresists and widely used in semiconductors, MEMS/micromachine applications, and the like. In such applications, photolithography is performed through the successive steps of pattern exposing on a substrate and developing in a developer for selective removal of the exposed areas or the non-exposed areas. The photoresists have a positive type and a negative type. A positive type allows the exposed portions to be dissolved in a developer. In contrast, the negative type allows the exposed portions to be insolubilized. In an advanced technology field, electropackage applications and MEMS applications require not only the capability of forming a uniform spin coating film, but also a high aspect ratio, the vertical sidewall profile of a thick film, high tight adhesion to a substrate, and the like. The aspect ratio is calculated from (resist film thickness)/(pattern line width), indicating the performance of photolithography as one of the important properties.

According to the composition having the main component of a bisphenol A type novolac epoxy resin disclosed in Patent Literature 1 and Non Patent Literature 1, a photosensitive image having an extremely high resolution and a high aspect ratio, and a cured product of photosensitive resin can be formed. However, the produced cured resin product tends to be weak for a physical stress depending on application, occasionally resulting in cracking (crazing) during development or when internal stress is generated. Accordingly, the cured resin product may cause not only reduction in adhesion depending on the type of substrate to which the resin composition is applied, but also peeling of the cured product from a substrate in some cases. All the problems occur during cure shrinkage of the composition due to the stress accumulated in the cured resin product. Large cure shrinkage causes bending (warpage) of a substrate in many cases.

Further, it has been found that a substrate with the cured resin product formed thereon causes peeling of the cured resin product from the substrate when subjected to an examination for resistance to moisture and heat that is an accelerated durability test (at 80° C., 100%, 24 hours). Accordingly, use of the cured resin product in applications in an MEMS package, a semiconductor package, a component for forming microreactors, and the like causes inconvenience with poor durability.

Patent Literature 2 discloses a resin composition including an epoxy resin, a novolac resin, a cationic photopolymerization initiator, and a filler is disclosed. The literature describes that use of the resin composition increases the adhesion of a coating film with reduced moisture permeation. It has been found, however, that the disclosed composition lacks resolution as a photoresist, and high adhesion cannot be achieved without inclusion of a filler. The resin composition in Patent Literature 2 is, therefore, not suitable for use in an MEMS package, a semiconductor package, a microreactor and the like.

CITATION LIST

Patent Literatures

Patent Literature 1: U.S. Pat. No. 4,882,245
Patent Literature 2: JP 2010-24364 A

Non Patent Literature

Non Patent Literature 1: N. LaBianca and J. D. Gelorme "HIGH ASPECT RATIO RESIST FOR THICK FILM APPLICATIONS", Proc. SPIE, Vol. 2438, p. 846 (1995)

SUMMARY OF INVENTION

Technical Problem

It is an object of the present invention, in view of the circumstances as described above, to provide an epoxy resin composition to be cured by cationic polymerization for use in the fields of semiconductors and MEMS/micromachine applications, i.e. a photosensitive resin composition enabling an image having a fine resolution, a low stress, and an adequate resistance to moisture and heat having a vertical sidewall profile to be formed; and/or a laminate thereof; and a cured product thereof.

Solution to Problem

Through extensive investigation, the present inventors found that the photosensitive resin composition of the present invention can solve the problem.

The various aspects of the present invention are as follows.

[1].

A photosensitive resin composition comprising: an epoxy resin (A), a polyhydric phenol compound (B), a cationic photopolymerization initiator (C), and an epoxy group-containing silane compound (D);

wherein the epoxy resin (A) comprises an epoxy resin (a) obtained from reaction of a phenol derivative represented by the following Formula (1) and epihalohydrin:

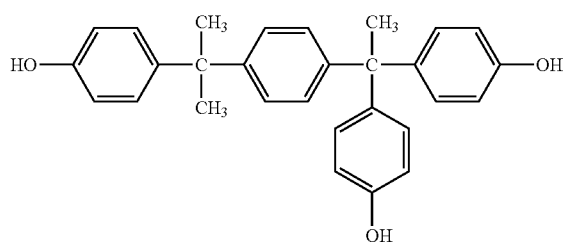

(1)

and an epoxy resin (b) represented by the following Formula (2):

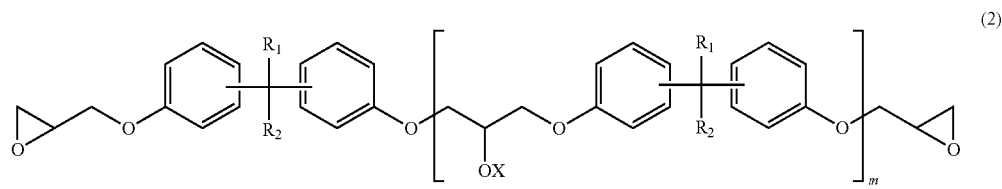

wherein m is an average value, representing a real number in the range from 2 to 30, $R_1$ and $R_2$ each independently represent a hydrogen atom, an alkyl group having 1 to 4 carbon atoms, or a trifluoromethyl group, each X independently represents a hydrogen atom or a glycidyl group, and at least one of a plurality of X present is a glycidyl group; and the polyhydric phenol compound (B) comprises one or more selected from the group consisting of phenol compounds represented by the following Formulas (3) to (6):

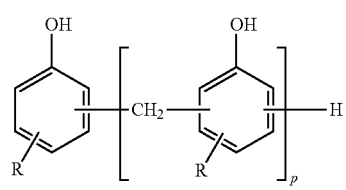

wherein p is an average value, representing a real number in the range from 1 to 10, and each R independently represents a hydrogen atom or an alkyl group having 1 to 4 carbon atoms;

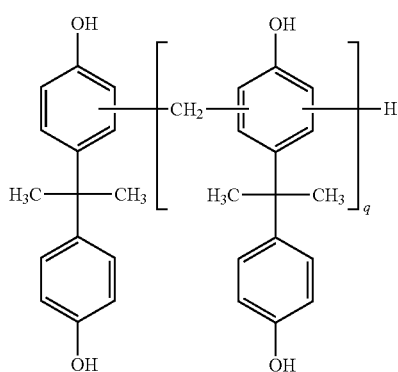

wherein q is an average value, representing a real number in the range from 1 to 10;

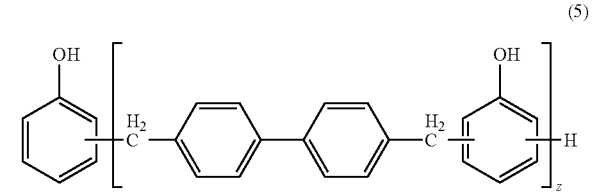

wherein z is an average value, representing a real number in the range from 1 to 10;

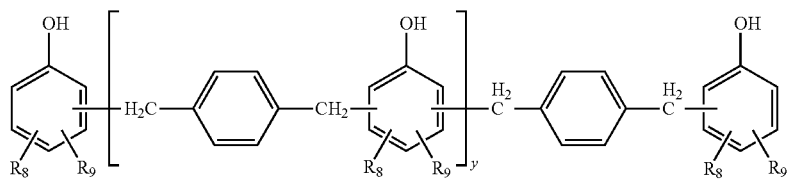

wherein y is an average value, representing a real number in the range from 1 to 10, and $R_8$ and $R_9$ each independently represent a hydrogen atom or an alkyl group having 1 to 4 carbon atoms.

[2].

The photosensitive resin composition according to the item [1], wherein a blending ratio of the polyhydric phenol compound (B) is 1 to 40 mass % relative to a mass of the epoxy resin (A).

[3].

The photosensitive resin composition according to the item [1], wherein a blending ratio of the cationic photopolymerization initiator (C) is 0.1 to 15 mass % relative to the total mass of the epoxy resin (A) and the polyhydric phenol compound (B).

[4].

The photosensitive resin composition according to the item [1], wherein the epoxy group-containing silane compound (D) is an epoxy group-containing alkoxysilane compound.

[5].

The photosensitive resin composition according to the item [1], wherein a blending ratio of the epoxy group-containing silane compound (D) is 1 to 15 mass % relative to the total mass of the epoxy resin (A), the polyhydric compound (B), and the cationic photopolymerization initiator (C).

[6].
The photosensitive resin composition according to the item [1], further comprising a solvent (E).

[7].
The photosensitive resin composition according to the item [6], wherein a blending ratio of the solvent (E) is 5 to 95 mass % relative to the total mass of the photosensitive resin composition including the solvent (E).

[8].
A cured product of the photosensitive resin composition according to any one of the items [1] to [7].

[9].
A resist laminate comprising the photosensitive resin composition according to any one of the items [1] to [7] sandwiched between two substrates.

[10].
A cured product of a dry film resist formed from the resist laminate according to the item [9].

Advantageous Effects of Invention

The photosensitive resin composition of the present invention enables a fine pattern having a vertical sidewall profile to be formed by photolithography, and the cured product thereof has properties of high resolution, low stress, and excellent resistance to moisture and heat. Accordingly, by using the photosensitive resin composition of the present invention, a permanent resist and a cured product having properties required in the field of semiconductors, and MEMS/micromachine applications, particularly required for MEMS packages, semiconductor packages and components for forming microreactors, can be produced.

DESCRIPTION OF EMBODIMENTS

The present invention is described in the following.
The epoxy resin (A) contained in the photosensitive resin composition according to the present invention comprises both of an epoxy resin (a) produced by a reaction of a phenol derivative represented by the Formula (1) and epihalohydrin, and an epoxy resin (b) represented by the Formula (2). Among them, the epoxy resin (a) contributes to the vertical sidewall profile and fine resolution of a cured product (pattern) produced from the photosensitive resin composition of the present invention by photolithography. The epoxy resin (a) can be produced from a phenol derivative represented by the Formula (1) and epihalohydrin by a conventionally known synthesis method of epoxy resins.

Examples of the general synthetic methods of the epoxy resin (a) include a method by adding alkali such as sodium hydroxide to a mixed solution of a phenol derivative represented by Formula (1) and epihalohydrin dissolved in a solvent capable of dissolving the same, and raising temperature to the reaction temperature for performing an addition reaction and a ring-closing reaction, repeating water washing of the reaction solution, separation and removal of the aqueous layer, and distilling off the solvent from the oil layer at the end. The halogen of epihalohydrin may be selected from F, Cl, Br and I, typically being Cl or Br. The reaction of the phenol derivative represented by Formula (1) and epihalohydrin is performed using epihalohydrin in an amount of, typically 0.3 to 30 mol, preferably 1 to 20 mol, more preferably 3 to 15 mol relative to 1 mole of the phenol derivative (equivalent to 3 mol of hydroxyl group). The epoxy resin (a) can be obtained by such a reaction, being typically present as a mixture of a plurality of products.

It is known that various types of the epoxy resin (a) comprising a different main component can be produced depending on the usage ratio between a phenol derivative represented by Formula (1) and epihalohydrin for use in the synthesis reaction. For example, in the case of using an excessive amount of epihalohydrin relative to the phenolic hydroxyl group of a phenol derivative, the epoxy resin (a) comprising a trifunctional epoxy resin as main component is produced with all the three phenolic hydroxyl groups in Formula (1) being epoxidized. As the usage of epihalohydrin is reduced relative to the phenolic hydroxyl groups, the content of polyfunctional epoxy resin having a large molecular weight increases, with a plurality of phenolic hydroxyl groups of the phenol derivative being bonded through epihalohydrin, and the balance of phenolic hydroxyl groups being epoxidized.

Examples of the method for producing the epoxy resin (a) comprising a multimer epoxy resin as main component include a method by further reacting the epoxy resin (a) with a phenol derivative, other than the method by controlling the usage ratio between the phenol derivative and epihalohydrin. The epoxy resin (a) produced through such a method also falls within the scope of the epoxy resin (a) of the photosensitive resin composition according to the present invention.

For the resin composition according to the present invention, the epoxy resin (a) comprising any one of the epoxy resin of phenol derivative monomer and the epoxy resin of phenol derivative multimer as main component may be used as long as the epoxy resin is produced from the reaction of a phenol derivative represented by Formula (1) and epihalohydrin. The epoxy resin (a) comprising any one of the epoxy resin of phenol derivative monomer, the epoxy resin of phenol derivative dimer (i.e. an epoxy resin having a structure with two phenol derivatives represented by Formula (1) bonded to each other through epihalohydrin), and the epoxy resin of phenol derivative trimer (i.e. an epoxy resin having a structure with three phenol derivatives represented by Formula (1) bonded to each other through epihalohydrin) as main component is preferred due to excellence in solvent solubility and easiness in handling with a low softening point. The epoxy resin (a) comprising the epoxy resin of phenol derivative monomer or the epoxy resin of phenol derivative dimer as main component is more preferred.

The term "main component" as used herein means an epoxy resin component with the largest content among a plurality of types of epoxy resins including epoxy resin monomer and epoxy resin multimers contained in the epoxy resin (a).

The specific structure of the epoxy resin (a) prepared from a monomer of the phenol derivative represented by Formula (1) is shown in the following Formula (7).

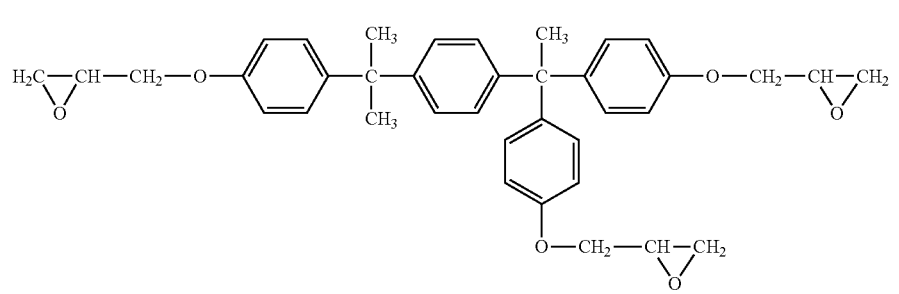
(7)
The specific structure of the epoxy resin (a) prepared from a dimer of the phenol derivative represented by Formula (1) is shown in the following Formula (8).
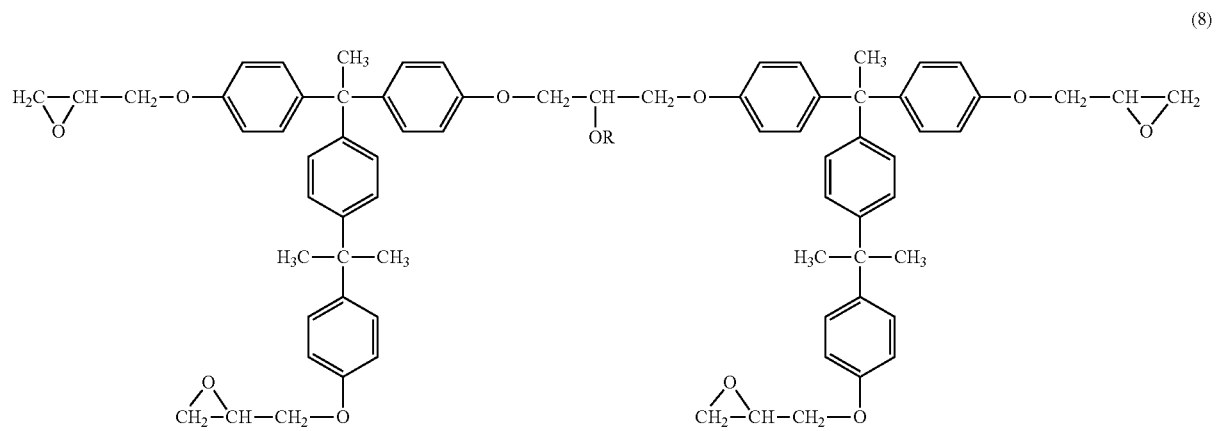
(8)
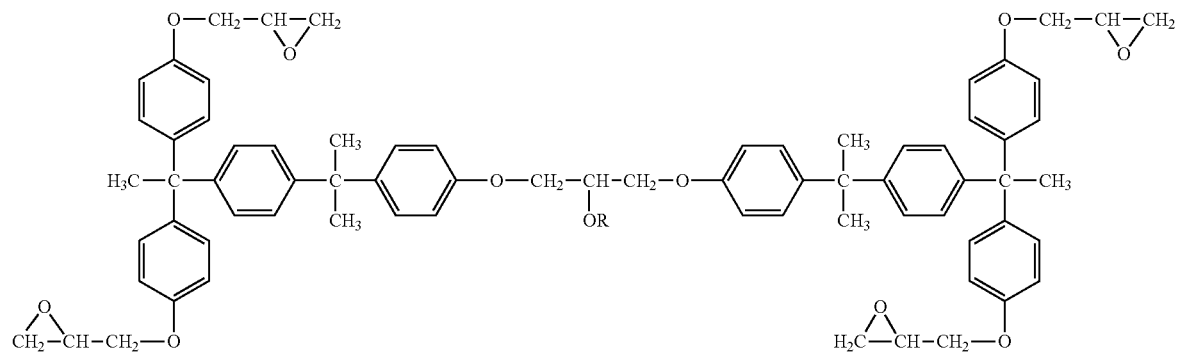

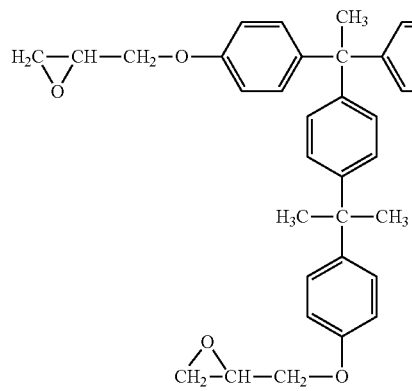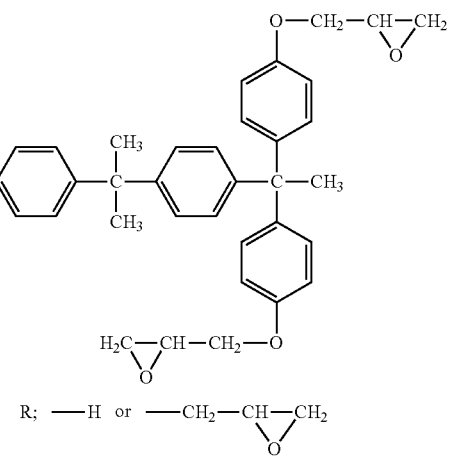
The specific structure of the epoxy resin (a) prepared from a trimer of the phenol derivative represented by Formula (1) is shown in the following Formula (9).

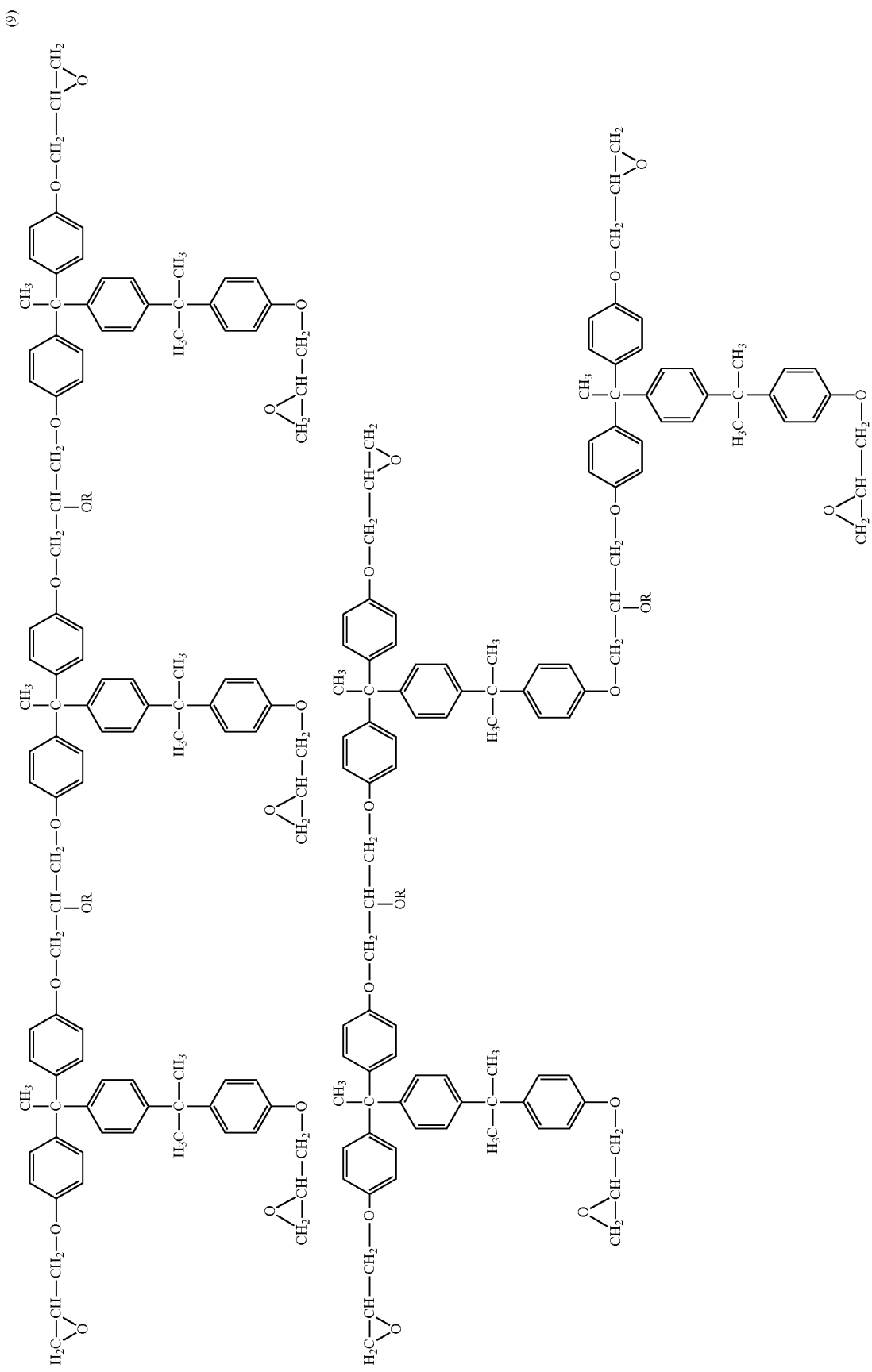

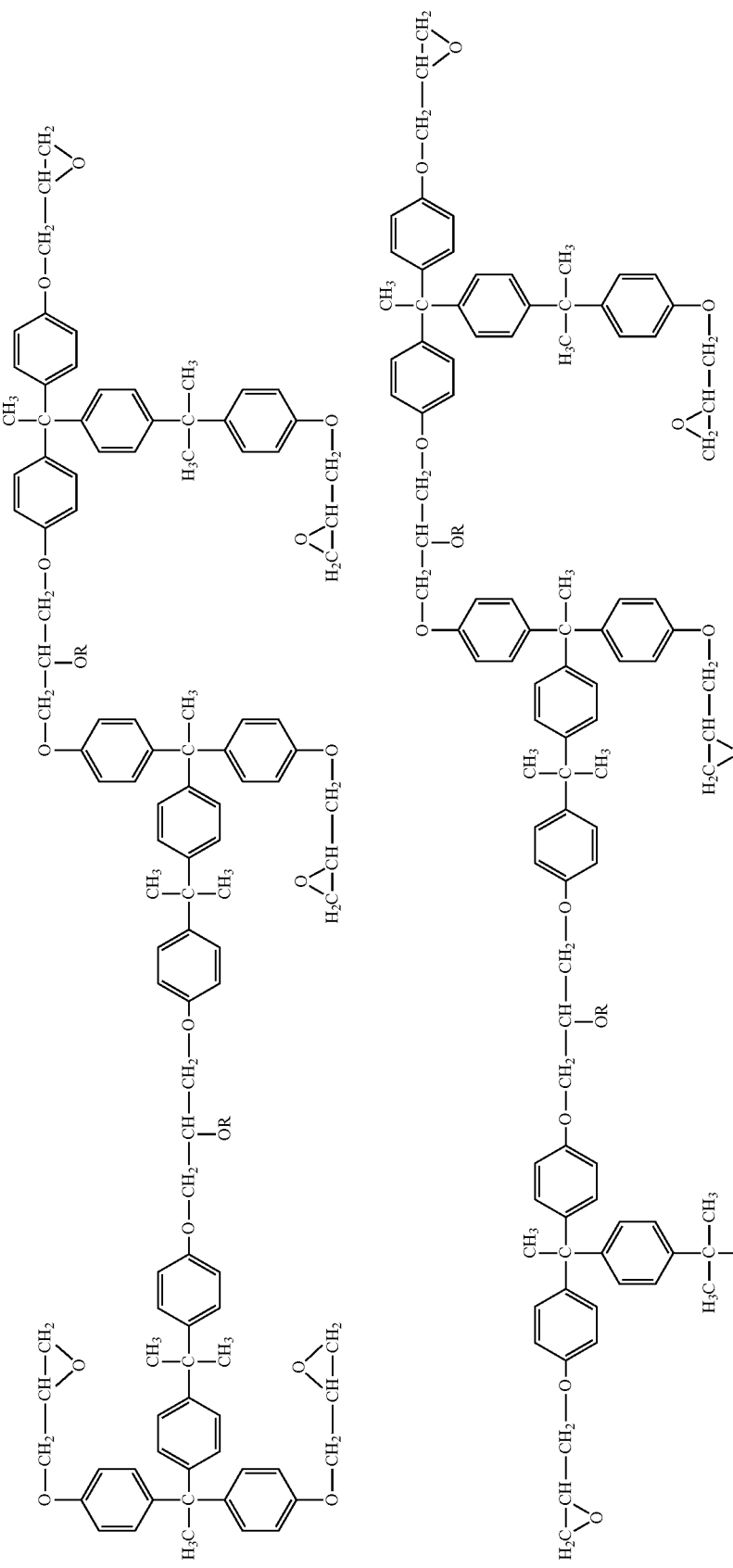

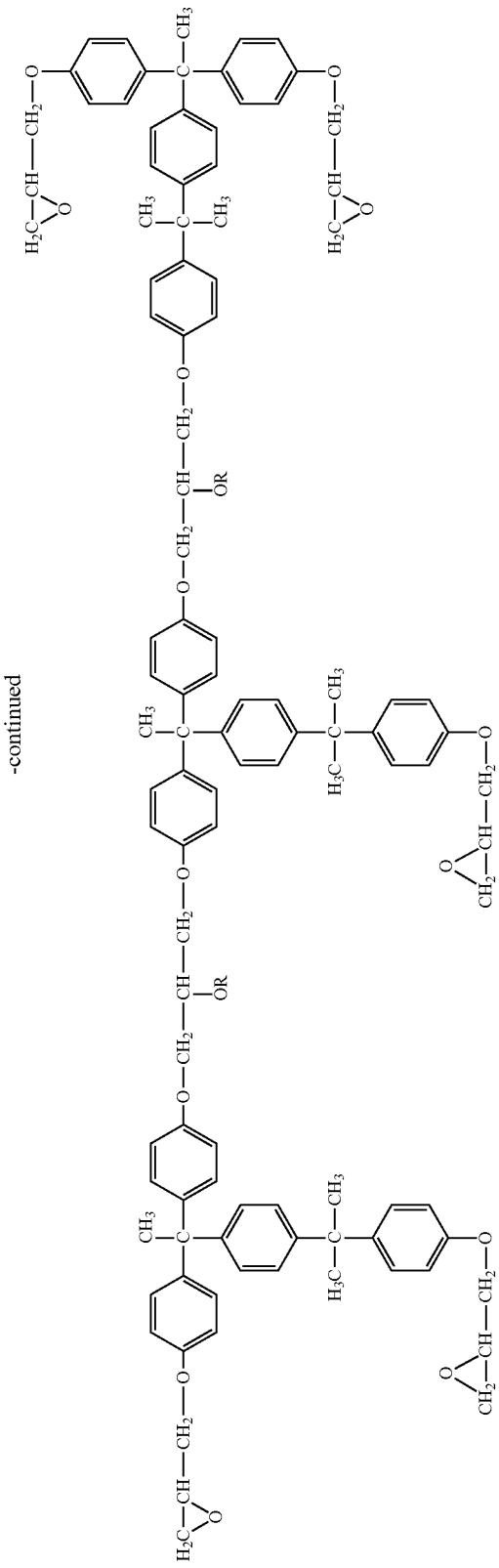

-continued
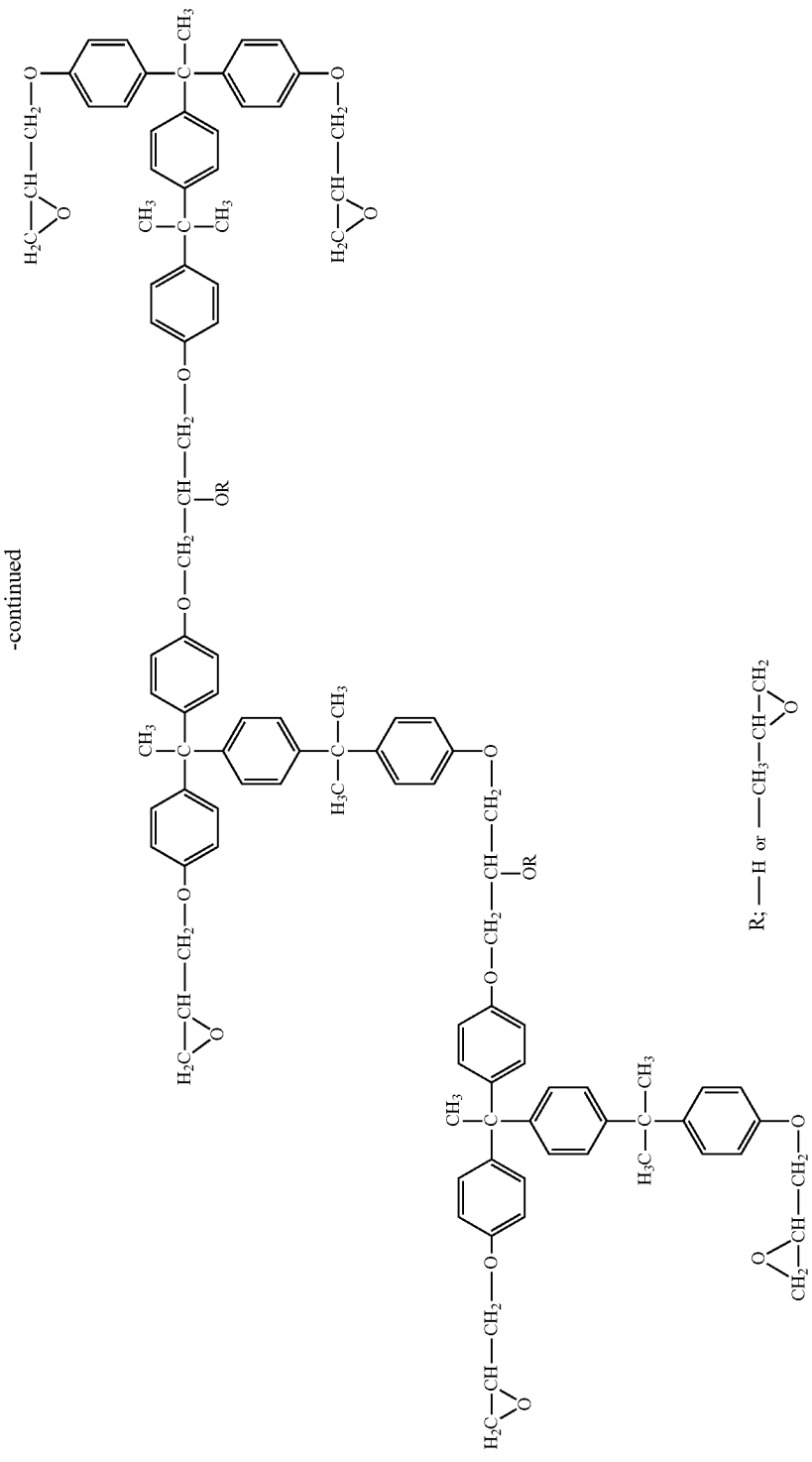

The epoxy resin (a) has a weight average molecular weight of preferably in the range from 500 to 12000, more preferably from 500 to 9000. Preferred examples thereof include NC-6300H (trade name, made by Nippon Kayaku Co., Ltd., epoxy equivalents: 220 to 240 g/eq., softening point: 60 to 85° C.). A weight average molecular weight referred to herein means the value calculated in terms of polystyrene based on GPC measurement results. The term epoxy equivalent referred to herein means the value measured in accordance with JIS K-7236. A softening point referred to herein also means the value measured in accordance with JIS K-7234.

Epoxy resin (b) imparts resolution and flexibility to a cured product (pattern) produced from the photosensitive resin composition of the present invention by photolithography. Due to the improvement in the properties with use of the epoxy resin (b), resistance to moisture and heat on adhesion of the cured product can be enhanced. The epoxy resin (b) can be produced by further reacting epichlorohydrin with a part of the alcoholic hydroxyl groups of a polycondensation product of bisphenol and epichlorohydrin. Specific examples thereof include NER-7604, NER-7403, and NER-1302 (trade names, manufactured by Nippon Kayaku Co., Ltd.). The epoxy resin (b) has epoxy equivalents of preferably 250 to 400 g/eq., and a softening point of preferably 60 to 85° C.

In the photosensitive resin composition of the present invention, the usage of the epoxy resin (b) is typically 2 to 4900 mass %, preferably 5 to 100 mass %, more preferably 10 to 70 mass % relative to the mass of the epoxy resin (a). With a usage of the epoxy resin (b) relative to the mass of the epoxy resin (a) of 4900 mass % or less, a photosensitive image pattern having a vertical sidewall profile can be easily formed with suppression of a rounded pattern. With a usage of the epoxy resin (b) relative to the mass of the epoxy resin (a) of 2 mass % or more, the occurrence of cracks in the photosensitive image pattern surface can be effectively prevented.

The epoxy resin (A), which the photosensitive resin composition of the present invention comprises, may further comprise an epoxy resin other than the epoxy resin (a) and the epoxy resin (b) for use in combination. The epoxy resin for combination use is not particularly limited, and the blending ratio thereof is not particularly limited as long as in the range not impairing the effects of the present invention. An epoxy group-containing silane compound (defined as component (D)), however, is not encompassed within the scope of the epoxy resin (A).

The polyhydric phenol compound (B) contained in the photosensitive resin composition according to the present invention comprises one or more selected from the group consisting of phenol compounds represented by the Formulas (3) to (6). The polyhydric phenol compound (B) is useful for preparation of a cured product with a high cross-linking density from the epoxy resin by heating. Consequently, the polyhydric phenol compound (B) can impart functions such as low moisture permeability, high adhesion, and excellent toughness to a cured resin product.

Examples of the polyhydric phenol compound represented by Formula (3) include a phenol novolac resin and a cresol novolac resin. One or more of these novolac resins may be selected for use. In particular, a phenol novolak resin is preferred because it has excellent coating properties. As the phenol novolac resin, one having a softening temperature of 50° C. or higher and 150° C. less is preferred and one having a softening temperature of 70° C. or higher and 100° C. or less is particularly preferred. Specific examples of the phenol novolac resin having a softening temperature of 50° C. or higher and 150° C. or lower include PN-152 (trade name, made by Meiwa Plastic Industries Ltd., softening point: 50° C., hydroxyl equivalents: 105 g/eq.), H-1 (trade name, made by Meiwa Plastic Industries Ltd., softening point: 80° C., hydroxyl equivalents: 104 g/eq.), TD-2131 (trade name, made by DIC Corporation, softening point: 80° C., hydroxyl equivalents: 105 g/eq.), and KA-1160 (trade name, made by DIC Corporation, softening point: 81° C., hydroxyl equivalents: 117 g/eq.). The novolac resin has hydroxyl equivalents of preferably 80 to 130 g/eq., particularly preferably 100 to 120 g/eq. from the viewpoint of compatibility with the epoxy resin as component (A), and low moisture permeability.

Examples of the polyhydric phenol compound represented by Formula (4) include a bisphenol A novolac resin, which is commercially available. Specific examples of the bisphenol A novolac resin include VH-4150 (trade name, made by DIC Corporation, softening point: 85° C., hydroxyl equivalents: 118 g/eq.), VH-4170 (trade name, made by DIC Corporation, softening point: 103° C., hydroxyl equivalents: 118 g/eq.), and MEP-6309E (trade name, made by Meiwa Plastic Industries Ltd., softening point: 81° C., hydroxyl equivalents: 116 g/eq.). One or more of the novolac resins may be used selectively.

Examples of the polyhydric phenol compound represented by Formula (5) include a biphenylphenol novolac resin, which is commercially available. Specific examples of the biphenylphenol novolac resin include KAYAHARD GPH-65 (trade name, made by Nippon Kayaku Co., Ltd., softening point: 65° C., hydroxyl equivalents: 200 g/eq.). One or more of the novolac resins may be used selectively.

Examples of the polyhydric phenol compound represented by Formula (6) include a phenol aralkyl resin, which is commercially available. Specific examples of the phenol aralkyl resin include MILEX XLC-3L (trade name, made by Mitsui Chemicals Inc., softening point: 77° C., hydroxyl equivalents: 176 g/eq.). One or more of the phenol aralkyl resin may be used selectively.

The blending ratio of the polyhydric phenol compound (B) in the photosensitive resin composition of the present invention is typically 1 to 40 mass %, preferably 4 to 30 mass %, further preferably 5 to 25 mass %, relative to the total mass of the epoxy resin (A). With a content of the polyhydric phenol compound (B) of 40 mass % or less, the difficulty in developing a photosensitive image pattern can be prevented. With a content of the polyhydric phenol compound (B) of 1 mass % or more, sufficient adhesion and moisture resistance can be easily obtained.

When a plurality of the polyhydric phenol compounds represented by one or more selected from Formulas (3) to (6) are used in combination, the ratio of each of the polyhydric phenol compounds used is not particularly limited as long as the blending ratio of the polyhydric phenol compound (B) relative to the mass of the epoxy resin (A) falls within the aforementioned range.

The polyhydric phenol compound (B) contained in the photosensitive resin composition according to the present invention may further comprise a polyhydric phenol compound other than the polyhydric phenol compounds represented by the Formulas (3) to (6) for use in combination. The polyhydric phenol compound for combination use is not particularly limited. The blending ratio of the polyhydric phenol compound for combination use is also not particularly limited as long as the range does not impair the effects of the present invention.

The cationic photopolymerization initiator (C) contained in the photosensitive resin composition according to the present invention is a compound which can generate cations when exposed to radiation of UV rays, far UV rays, excimer laser such as KrF and ArF, X rays, electron beams, and the like, and then the generated cations can act as a polymerization initiator.

Examples of the cationic photopolymerization initiator (C) include an aromatic iodonium complex salt and an aromatic sulfonium complex salt. Among them, specific examples of the aromatic iodonium complex salt include diphenyl iodonium tetrakis(pentafluorophenyl)borate, diphenyl iodonium hexafluorophosphate, diphenyl iodonium hexafluoroantimonate, di(4-nonylphenyl)iodonium hexafluorophosphate, tolylcumyl iodonium tetrakis(pentafluorophenyl)borate (trade name: RHODORSIL PI2074, made by Rhodia), and di(4-tert-butyl)iodonium tris(trifluoromethanesulfonyl)methanide (trade name CGI BBI-C1, made by BASF Corporation).

Specific examples of the aromatic sulfonium complex salt include 4-thiophenyl diphenyl sulfonium hexafluoroantimonate (trade name: CPI-101A, made by San-Apro Ltd.), thiophenyldiphenyl sulfonium tris(pentafluoroethyl)trifluorophosphate (trade name: CPI-210S, made by San-Apro Ltd.), 4-{4-(2-chlorobenzoyl)phenylthio}phenyl bis(4-fluorophenyl)sulfonium hexafluoroantimonate (trade name: SP-172, made by ADEKA Corporation), a mixture of aromatic sulfonium hexafluoroantimonate containing 4-thiophenyldiphenyl sulfonium hexafluoroantimonate (trade name: CPI-6976, made by ACETO Corporation, USA), triphenylsulfonium tris(trifluoromethanesulfonyl)methanide (trade name: CGI TPS-C1, made by BASF Corporation), tris[4-(4-acetylphenyl)sulfonylphenyl]sulfonium tris(trifluoromethylsulfonyl)methide (trade name: GSID 26-1, made by BASF Corporation), and tris[4-(4-acetylphenyl)sulfonylphenyl]sulfonium tetrakis(2,3,4,5,6-pentafluorophenyl)borate (trade name: IRGACURE PAG290, made by BASF Corporation).

Among the cationic photopolymerization initiators, an aromatic sulfonium complex salt is preferred due to the high processability into a vertical rectangle and the high thermal stability in the photosensitive image forming step. In particular, 4-{4-(2-chlorobenzoyl)phenylthio}phenyl bis(4-fluorophenyl)sulfonium hexafluoroantimonate, a mixture of aromatic sulfonium hexafluoroantimonate containing 4-thiophenyl diphenyl sulfonium hexafluoroantimonate, and tris[4-(4-acetylphenyl)sulfonylphenyl]sulfonium tetrakis(2,3,4,5,6-pentafluorophenyl)borate are preferred.

The cationic photopolymerization initiators (C) may be singly used or two or more of them may be used in combination. The cationic photopolymerization initiator component (C) has a function to absorb light. Accordingly, when a thick film (e.g. 50 μm or more) is to be formed from the resin composition, use of not excessive amounts of the component (C) (e.g. 15 mass % or less) is preferred for light to permeate sufficiently into the depth for curing. On the other hand, in order to obtain a sufficient curing rate of a thick film, use of a certain amount of the component (C) (e.g. 3 mass % or more) is preferred. When a thin film is formed from the resin composition, the component (C) exhibits sufficient performance for initiating polymerization with a small amount of addition (e.g. 1 mass % or more). In the case of a thin film, the optical transparency to the depth is not greatly reduced even if a large amount of the component (C) is used. However, it is preferred to use not excessive amounts of the component (C) in view of economy (i.e. to prevent unnecessary consumption of an expensive initiator).

Considering these factors, the blending ratio of the cationic photopolymerization initiator (C) in the photosensitive resin composition of the present invention is typically 0.1 to 15 mass %, preferably 0.2 to 8 mass % relative to the total mass of the epoxy resin component (A) and the polyhydric phenol compound component (B), though not particularly limited thereto. When the cationic photopolymerization initiator (C) has a high molar absorption coefficient in wavelength region of 300 to 380 nm, however, the amount blended is required to be properly adjusted depending on the thickness of the photosensitive resin composition to be used.

The epoxy group-containing silane compound (D) contained in the photosensitive resin composition according to the present invention helps to improve the tight adhesion to a substrate in the process of using the composition, and further improve the interlayer adhesion of a multi-layer structure made from the composition. The epoxy group-containing silane compound (D) does not interfere the storage stability of the photosensitive resin composition of the present invention.

Preferred examples of the epoxy group-containing silane compound (D) include an epoxy group-containing alkoxysilane compound. Examples of the epoxy group-containing alkoxysilane compound include 3-glycidoxypropyltrimethoxysilane, 3-glycidoxypropylmethyldimethoxysilane, 3-glycidoxypropyltriethoxysilane, and 2-(3,4-epoxy cyclohexyl)ethyltrimethoxysilane. These may be used singly or two or more of them may be used in combination.

The blending ratio of the epoxy group-containing silane compound (D) in the photosensitive resin composition of the present invention is typically 1 to 15 mass %, preferably 3 to 10 mass % relative to the total mass of the epoxy resin (A), the polyhydric phenol compound (B), and the cationic photopolymerization initiator (C).

The photosensitive resin composition of the present invention may contain a solvent (E) to reduce the viscosity of the resin composition for improvement in the coatability. An organic solvent for common use in paints, inks, and the like may be used as the solvent without specific limitations, as long as each of the components of the photosensitive resin composition can be dissolved therein without chemical reactions with the components. Specific examples of the solvent (E) include: ketones such as acetone, ethyl methyl ketone, methyl isobutyl ketone, and cyclopentanone; aromatic hydrocarbons such as toluene, xylene, and methoxybenzene; glycol ethers such as dipropylene glycol dimethyl ether and dipropylene glycol diethyl ether, and propylene glycol monomethyl ether; esters such as ethyl lactate, ethyl acetate, butyl acetate, methyl-3-methoxy propionate, carbitol acetate, propylene glycol monomethyl ether acetate, and γ-butyrolactone; alcohols such as methanol and ethanol; aliphatic hydrocarbons such as octane and decane; and petroleum solvents such as petroleum ether, petroleum naphtha, hydrogenated petroleum naphtha and solvent naphtha.

These solvents may be used singly or two or more of them may be used in combination. The solvent (E) is added to adjust the film thickness and the coatability during the application of the composition to a substrate. The usage of the solvent (E) may be typically 95 mass % or less in the photosensitive resin composition containing the solvent in order to properly control the solubility of the main component of the resin composition, the volatility of each of the components, the viscosity of the composition, and the like. The usage is preferably 5 to 95 mass %, more preferably 10 to 90 mass %.

The photosensitive resin composition of the present invention may further comprise a sensitizer for absorbing UV rays and imparting the absorbed light energy to the cationic photopolymerization initiator, in particular, to an aromatic iodonium complex salt. Preferred examples of the sensitizer include thioxanthones and anthracene compounds having alkoxy groups at $9^{th}$ and $10^{th}$ positions (9,10-dialkoxyanthracene derivatives). Examples of the alkoxy group include C1 to C4 alkoxy groups such as a methoxy group, an ethoxy group, a propoxy group, and a butoxy group. The 9,10-dialkoxyanthracene derivatives may further have a substituent. Examples of the substituent include a halogen atom such as a fluorine atom, a chlorine atom, a bromine atom, and an iodine atom, C1 to C4 alkyl groups, a sulfonic acid alkyl ester group, and a carboxylic acid alkyl ester group. Examples of the alkyl in the sulfonic acid alkyl ester group and the carboxylic acid alkyl ester group include C1 to C4 alkyls. The substitution position for the substituents is preferably $2^{nd}$ position.

Specific examples of the thioxanthones include 2,4-dimethylthioxanthone, 2,4-diethylthioxanthone, 2-chlorothioxanthone, 2-isopropylthioxanthone, and 2,4-diisopropylthioxanthone. In particular, 2,4-diethylthioxanthone (trade name: KAYACURE DETX-S, made by Nippon Kayaku Co., Ltd.) and 2-isopropylthioxanthone are preferred.

Examples of the 9,10-dialkoxyanthracene derivatives include 9,10-dimethoxyanthracene, 9,10-diethoxyanthracene, 9,10-dipropoxyanthracene, 9,10-dibutoxyanthracene, 9,10-dimethoxy-2-ethylanthracene, 9,10-diethoxy-2-ethylanthracene, 9,10-dipropoxy-2-ethylanthracene, 9,10-dimethoxy-2-chloroanthracene, 9,10-dimethoxyanthracene-2-sulfonic acid methyl ester, 9,10-diethoxy anthracene-2-sulfonic acid methyl ester, and 9,10-dimethoxyanthracene-2-carboxylic acid methyl ester.

The sensitizers may be used singly or two or more of them may be used in combination. Use of 2,4-diethylthioxanthone and 9,10-dimethoxy-2-ethylanthracene is most preferred. Since a small amount of sensitizer can exhibit the effect, the usage ratio thereof is typically 30 mass % or less, preferably 20 mass % or less relative to the mass of the cationic photopolymerization initiator component (C).

In order to reduce adverse effects of the ions derived from the cationic photopolymerization initiator (C), an ion catcher may be added to the resin composition of the present invention, on an as needed basis. Specific examples of the ion catcher include: an alkoxy aluminum such as tris methoxy aluminum, tris ethoxy aluminum, tris isopropoxy aluminum, isopropoxy diethoxy aluminum, and tris butoxy aluminum; a phenoxy aluminum such as tris phenoxy aluminum and tris p-methylphenoxy aluminum; and an organic aluminum compound such as tris acetoxy aluminum, tris stearate aluminum, tris butyrate aluminum, tris propionate aluminum, tris acetylacetonate aluminum, tris trifluoro acetylacetonate aluminum, tris ethylacetoacetate aluminum, diacetylacetonate dipivaloylmethanate aluminum, and diisopropoxy(ethylacetoacetate)aluminum. These components may be used singly or two or more of them may be used in combination. The amount thereof blended may be typically 10 mass % or less relative to the total mass of the epoxy resin (A), the polyhydric phenol compound (B), and the cationic photopolymerization initiator (C).

The photosensitive resin composition of the present invention may comprise various additives such as a thermoplastic resin, a colorant, a thickener, a defoamer, and a leveling agent on an as needed basis. Examples of the thermoplastic resin include polyether sulfone, polystyrene, and polycarbonate. Examples of the colorant include phthalocyanine blue, phthalocyanine green, iodine green, crystal violet, titanium oxide, carbon black, naphthalene black, anthraquinone red, quinacridone red, and diketopyrrolopyrrole red. The rough guide for the amount of each of the additives used is, for example, 0 mass % or more and 30 mass % or less in the photosensitive resin composition according to the present invention, excluding the solvent. The amount for each used, however, may be appropriately increased or decreased depending on the intended use thereof and the required function of the cured film.

Examples of the thickener include Orben, Bentone, and montmorillonite. Examples of the defoamer include a silicone defoamer, a fluoroalkyl defoamer, and a polymer defoamer. The rough guide for the amount of each of the additives used is, for example, 0 mass % or more and 10 mass % or less in the photosensitive resin composition according to the present invention, excluding the solvent. The amount for each used, however, may be appropriately increased or decreased depending on the intended use thereof and the required quality of the coating.

The photosensitive resin composition of the present invention may further comprise an optional inorganic filler such as barium sulfate, barium titanate, silicon oxide, amorphous silica, talc, clay, magnesium carbonate, calcium carbonate, aluminum oxide, aluminum hydroxide, montmorillonite, and mica powder. The amount of the inorganic filler used may be typically 0 mass % or more and 60 mass % or less relative to the mass of the photosensitive resin composition according to the present invention, excluding the solvent. The amount used, however, may be appropriately increased or decreased depending on the intended use and the required function of the cured film. Similarly, an organic filler such as polymethyl methacrylate, rubber, a fluoro polymer, and polyurethane powder may be incorporated into the photosensitive resin composition of the present invention.

The photosensitive resin composition of the present invention may be prepared by mixing and stirring essential components of the epoxy resin (A), the polyhydric phenol compound (B), the cationic photopolymerization initiator (C), and the epoxy group-containing silane compound (D), and, on an as needed basis, together with optional components including the solvent (E), a sensitizer, an ion catcher, a thermoplastic resin, a colorant, a thickener, a defoamer, a leveling agent, and an inorganic filler, by a conventional method. In the step of mixing and stirring, a disperser such as a dissolver, a homogenizer, and a three-roll mill may be used on an as needed basis. In addition, mixing may be followed by filtration with use of a mesh, a membrane filter, or the like.

The process for forming a cured resist film from the photosensitive resin composition of the present invention is described in the following.

The photosensitive resin composition of the present invention may be used in a liquid form, preferably with addition of a solvent for application to a substrate. The application may be conducted by a spin coating method comprising the steps of: measuring and dispensing the photosensitive resin composition of the present invention diluted to a desired viscosity with a solvent onto a substrate; accelerating the rotation of the substrate up to a predetermined rotation speed; and maintaining the rotation speed at constant so as to obtain a desired film thickness. Spin coating can be carried out at various rotation speeds for control of the film thickness. Alternatively, the photosensitive resin composition can be applied to a substrate by other coating method such as roller coating, doctor knife coating, slot coating, immersion coating, gravure coating, and spray coating.

After coating, the solvent can be evaporated by dry baking. The drying baking conditions can be selected to form a semi-cured dry coating film of a photoresist. In typical conditions, using a hot plate with a smooth surface, a coating film in contact with the surface or in a nearly contacting state may be dried at 65° C. for 1 to 15 minutes, and subsequently at 90 to 125° C. for 5 to 120 minutes depending on the thickness of the coating film, the volatility of solvent, and the thermal conductivity and thickness of the substrate. Alternatively, the dry baking may be performed in a convection oven. Subsequently, the dried coating film of the photosensitive resin composition is subjected to exposure to bright lines in a near UV wavelength range of 300 to 500 nm from a medium pressure or ultra-high pressure mercury lamp through a photo mask with a desired mask pattern, energy ray irradiation with X-ray radiation from a synchrotron radiation source, or electron beam irradiation with a direct or patterned exposure, so that a photosensitive image can be formed. A contact printing, a proximity printing, or a projection printing may be employed. Subsequently to the exposure, post exposure baking may be conducted in order to accelerate the polymerization reaction by acid catalyst activity at the exposed regions in the coating film. The typical conditions include processing on the hot plate at 65° C. for 1 to 5 minutes and subsequently at 95° C. for 1 to 60 minutes depending on the thickness of the coating film and the thermal conductivity and thickness of the substrate.

Subsequently, in order to dissolve and remove unexposed regions, immersion in an organic solvent developer for 2 to 30 minutes may be typically conducted depending on the thickness of the coating film and the titer of the developer solvent. Further, the developer attached to the cured film can be removed by rinsing the developed image with application of a rinsing solvent. The attached developer contains the dissolved photoresist components, easily causing pollution as residues on a photosensitive image when dried. Accordingly, removal of the attached developer is desired. In the immersion method, the attachment of such residues can be prevented by multi-stage development with preparation of a clean developer tank.

Alternatively, the developer solvent can be applied by spraying with use of any one of an explosion-proof atomizing spray nozzle and an explosion-proof micro-shower head spray nozzle. Examples of alternative development methods further include applying developer by a puddle method. In general, the puddle method includes the successive steps of: placing a substrate as development target on a rotating tool head; measuring and dispensing an adequate amount of developer to form a layer or a puddle stagnating on the entire area of the substrate rotating at a low speed; stopping the rotation of the substrate, standing the formed developer puddle still on the substrate for a predetermined time; accelerating the rotation of the substrate for removal of the used developer by spinning; and decelerating the rotation until stopped. The sequence is typically repeated several times on an as needed basis, until a clear photosensitive image is obtained.

Examples of the suitable developer include propylene glycol monomethyl ether acetate, γ-butyrolactone, acetone, cyclopentanone, diacetone alcohol, tetrahydrofurfuryl alcohol, N-methylpyrrolidone, anisole, and ethyl lactate, though not particularly limited thereto. Propylene glycol monomethyl ether acetate is particularly preferred, capable of well dissolving unexposed regions with relatively low cost.

Examples of the suitable rinsing solution include the developer solvents described above, and methanol, ethanol, isopropanol and n-butyl acetate. Among these, acetone, ethanol and isopropanol are particularly preferred, capable of speedy cleaning and rapid drying.

Following the rinsing step, a heating treatment may be conducted under a temperature condition at 130 to 200° C. corresponding to the resistance to heat of the substrate, as the last step of manufacturing the cured film. By thermally curing the film, a permanent cured film (resist) satisfying various properties can be obtained.

Examples of the usable substrate material include silicon, silicon dioxide, tantalum, lithium tantalate, silicon nitride, alumina, glass, glass ceramics, gallium arsenide, indium phosphide, copper, aluminum, nickel, iron, steel, copper-silicon alloy, glass coated with indium-tin oxide, an organic film such as polyimide and polyester, metals, semiconductors, and any substrate containing patterned regions of insulating material, though not particularly limited thereto.

The photosensitive resin composition of the present invention may be also used to form a resist laminate by sandwiching the composition by two substrates. For example, after the photosensitive resin composition diluted with a solvent is applied onto a base film (substrate) with use of a roll coater, a die coater, a knife coater, a bar coater, a gravure coater, or the like, the solvent is removed in a drying oven set at 45 to 100° C. Subsequently a cover film (substrate) is laminated thereon to produce a resist laminate. On this occasion, the thickness of the resist on the base film may be controlled to fall within the range from 2 to 100 μm. Examples of the base film and the cover film for use as substrates include films of polyester, polypropylene, polyethylene, TAC, and polyimide. These films may be release-treated with a silicone release agent, a non-silicone release agent, or the like, on an as needed basis. When the resist laminate is used, for example, the cover film is detached, followed by transferring the resist laminate to the substrate at a temperature of 40 to 100° C., under a pressure of 0.05 to 2 MPa, with a hand roll, a laminator, or the like, and the transferred resist laminate is then subjected to exposure, post exposure baking, development, and heating treatment in the same way as in the case of the liquid photosensitive resin composition.

The resist laminate of the present invention enables use of the photosensitive resin composition in a dry film resist form, so that the steps of coating to a support or a substrate and drying can be omitted. Formation of a fine pattern with use of the photosensitive resin composition of the present invention can be thereby more easily achieved.

When the cured film is used for a MEMS package, a semiconductor package, and/or a component for forming microreactors, the photosensitive resin composition of the present invention is applied to a substrate and dried to form a first layer of the photosensitive resin coating film. The first layer is subjected to exposure and post exposure baking, to which the photosensitive resin composition is further applied and dried to form a second layer of the photosensitive resin coating film. The second layer is then subjected to exposure and post exposure baking. The steps are repeated and development and hard baking are collectively conducted in the final step, so that a complicated multi-layered pattern can be formed. As another embodiment, a multi-layered pattern may be formed by developing and hard baking a first layer of the photosensitive resin composition, applying and drying a second layer of the photosensitive resin composition, conducting alignment exposure through a photo mask, and repeating development and hard baking. As still another embodiment, the photosensitive resin layers may be formed by laminating dry film resists.

The term "package" represents a sealing method or sealed product for use in blocking intrusion of gas and liquid from outside so as to keep the stability of a substrate, a wiring, a device, and the like. The package described herein includes: a hollow package for packing a product having a drive unit such as MEMS and an oscillator of an SAW device and the like; a surface protection for preventing deterioration of a semiconductor substrate, a printed wiring board, a wiring, and the like; a resin seal for sealing components for forming microreactors with a top plate; and the like. The term "wafer level package" represents: a product made by successive steps of protective film formation, terminal processing and wiring, and packaging in a wafer state, followed by cutting out into individual chips from the wafer; or a method for three-dimensional processing fine flow paths or orifice plates of the order of from some nanomers to micrometers collectively within a wafer.

With use of the photosensitive resin composition of the present invention, a fine pattern having a vertical sidewall profile can be formed by photolithography. The cured product thereof has properties of low stress and excellent resistance to moisture and heat. The present invention can provide a permanent resist and a cured product which satisfy the properties required in the fields of semiconductors and MEMS/micromachine applications, in particular, an MEMS package, a semiconductor package, a component for forming microreactors, being very useful in these fields.

EXAMPLES

The present invention is described in detail in the following, with reference to Examples. The Examples are provided for favorably illustrative purposes only, but are not intended to limit the present invention.

Examples 1 to 7 and Comparative Examples 1 to 5

Preparation of Solution of Photosensitive Resin Composition (Liquid Resist)

In accordance with the amounts blended described in Table 1 (unit in parts by mass) where the amounts for a solution product are shown in terms of solid content of the component, the epoxy resin (A), the polyhydric phenol compound (B), the cationic photopolymerization initiator (C), and the epoxy group-containing silane compound (D) were diluted with cyclopentanone so as to have a concentration of 65 mass %, and mixed and dissolved in a flask having a stirrer at 60° C. for 1 hour. After cooling, filtration was conducted with a membrane filter with a pore size of 1.0 μm, so that each of the photosensitive resin composition solutions (liquid resist) of the present invention and for comparison was obtained.

Patterning of Photosensitive Resin Composition

Each of the liquid resists obtained in Examples 1 to 7, and Comparative Examples 1 to 5 was applied to a silicon wafer with a spin coater, and then subjected to pre-baking for 10 minutes with a hot plate at 95° C., so that a photosensitive resin composition layer having a dry film thickness of 25 μm after coating was obtained. The bulge portion of the coating film at a wafer edge face was then dissolved and removed. After drying, the coating film was exposed to the i-line in an amount of exposure of 500 mJ/cm² (soft contact) with an i-line exposure device (MASK ALIGNER made by Ushio Inc.) through a photo mask having a gray scale for resolution evaluation. Subsequently, post exposure baking (hereinafter referred to as "PEB") was conducted for 5 minutes with a hot plate at 95° C. Subsequently, immersion development was conducted at 23° C. for 3 minutes with SU-8 DEVELOPER (trade name, made by MicroChem Corp., mainly composed of propylene glycol monomethyl ether acetate). After rinsing with isopropanol and drying, a resin pattern cured on the silicon wafer was obtained.

Evaluation of Sensitivity, Resolution, and Film Crazing of Photosensitive Resin Composition Sensitivity The dose of exposure to achieve the best mask transfer accuracy in the patterning was defined as the optimal dose of exposure, and the sensitivity of each of the photosensitive resin compositions was evaluated. The smaller the optimal dose of exposure is, the higher the sensitivity is. The results are shown in the Table 1 below.

Resolution

After the steps of pre-baking, dissolving and removing the bulge portion of the coating film at the wafer edge face, and drying, each of the liquid resists was subjected to the optimal dose of exposure for each composition (soft contact, i-line; refer to the dose of exposure in Table 1) using a photo mask having 1 to 100 μm lines-and-spaces and a circular hole pattern, and then subjected to PEB for 5 minutes with a hot plate at 95° C. Subsequently, immersion development was performed at 23° C. for 3 minutes with SU-8 DEVELOPER (trade name, made by MicroChem Corp., mainly composed of propylene glycol monomethyl ether acetate). Rinsing with isopropanol and subsequent drying were then performed. Among the resolved resist patterns in a vertical sidewall profile without bending and residues, the width of the finest pattern tightly adhered to the substrate was measured for evaluation of the resolution. The results are shown in the Table 1 below.

Evaluation of Crazing of Film

The occurrence of cracks in the film surface of the photosensitive image pattern obtained from each of the liquid resists was observed with an optical microscope for evaluation of the crazing of the film. The evaluation criteria "◯" (good) stands for the case of no occurrence of cracks at all, and "X" (poor) stands for the case of occurrence of cracks. The results are shown in the Table 1 below.

Evaluation of Resistance to Moisture and Heat on Adhesion of Cured Product of Photosensitive Resin Composition Each of the liquid resists obtained in Examples 1 to 7 and Comparative Examples 1 to 5 was applied onto a silicon wafer with a spin coater, and then prebaked for 10 minutes with a hot plate at 95° C., so that a photosensitive resin composition layer having a dry film thickness of 25 μm after coating was obtained. The bulge portion of the coating film at a wafer edge face was then dissolved and removed. After drying, the coating film was exposed to the optimal dose of exposure for each composition (soft contact, i-line; refer to the dose of exposure in Table 1) with an i-line exposure device (MASK ALIGNER made by Ushio Inc.) through a pattern photo mask for evaluation of resistance to moisture and heat on adhesion. Subsequently, PEB was conducted for 5 minutes with a hot plate at 95° C. Subsequently, immersion development was conducted at 23° C. for 3 minutes with SU-8 DEVELOPER (trade name, made by MicroChem Corp., mainly composed of propylene glycol monomethyl ether acetate). After rinsing with isopropanol and drying, through a hard baking treatment in an oven at 200° C. for 60 minutes, a resin pattern cured on the silicon wafer was obtained.

The wafer having the resin pattern was cut into pieces. Each of the pieces was individually immersed in each of a water-soluble organic solvent-containing aqueous solution A (composition: 10 mass % of 2-imidazolidinone, 7.5 mass % of 2,2'-sulfonyldiethanol, 5 mass % of glycerol, 5 mass % of pentylene glycol, and 0.4 mass % of ethylene oxide-modified acetylenol), a water-soluble organic solvent-containing aqueous solution B (composition: 30 mass % of gamma butyrolactam, 10 mass % of 2,2'-oxydiethanol, 5 mass % of hexamethylene glycol, and 0.2 mass % of ethylene oxide-modified acetylenol), and a water-soluble organic solvent-containing aqueous solution C (composition: 15 mass % of glycerol, 5 mass % of polyethylene glycol #400, and 3 mass % of polyoxyethylene lauryl ether), in a PTFE internal cylinder-type closed vessel, and each of the cut and immersed wafer pieces was then subjected to a test for durability under moisture and heat at 80° C. for 24 hours. The adhesion force of the resin pattern before and after the test was determined with a shear strength testing machine. The case having no deterioration in the adhesion force was considered "◯" (good). The case having deterioration in the adhesion force was considered "X" (poor). The case having detachment or peeling of pattern after the test was considered "XX" (very poor). The results are shown in the Table 1 below.

(A-5): EOCN-1020 (trade name, made by Nippon Kayaku Co., Ltd.; an o-cresol novolac type epoxy resin; epoxy equivalents: 197 g/eq.)

(A-6): CELLOXIDE 2021P (trade name, made by Daicel Corporation, an alicyclic epoxy compound, epoxy equivalents: 126 g/eq.)

(A-7): jER YL-983U (trade name, made by Mitsubishi Chemical Corporation; an epoxy resin represented by Formula (2), with $R_1$ and $R_2$ representing a hydrogen atom, and all the X representing a hydrogen atom; epoxy equivalents: 170 g/eq.)

(B-1): PN-152 (trade name, made by Meiwa Plastic Industries, Ltd.; a polyhydric phenol compound represented by Formula (3), with R representing a hydrogen atom and with p is approximately 4; softening point: 50° C.; hydroxyl equivalents: 105 g/eq.)

(B-2): H-1 (trade name, made by Meiwa Plastic Industries, Ltd.; a polyhydric phenol compound represented by Formula (3), with R representing a hydrogen atom and with p is approximately 5; softening point: 80° C.; hydroxyl equivalents: 104 g/eq.)

TABLE 1

Components and evaluation results of photosensitive resin composition

| | | Example No. | | | | | | | Comparative Example No. | | | | |
|---|---|---|---|---|---|---|---|---|---|---|---|---|---|
| | | 1 | 2 | 3 | 4 | 5 | 6 | 7 | 1 | 2 | 3 | 4 | 5 |
| Epoxy resin (A) | (A-1) | 57.25 | 67.25 | 62.5 | 80 | 80 | 80 | 67.25 | | 56 | | 98 | |
| | (A-2) | 22.75 | 22.75 | 22.5 | | 15 | 15 | 22.75 | | 14 | | | |
| | (A-3) | | | | 15 | | | | | | | | |
| | (A-4) | | | | | | | | 100 | | | | |
| | (A-5) | | | | | | | | | | | | 97.5 |
| | (A-6) | | | | | | | | | | 45 | | |
| | (A-7) | | | | | | | | | | 45 | | |
| Polyhydric phenol compound (B) | (B-1) | 10 | | 15 | | | 10 | | | | | 2 | |
| | (B-2) | | 10 | | | | | | | 10 | | | |
| | (B-3) | | | | 5 | | | | | | | | |
| | (B-4) | | | | | 5 | | | | | | | |
| | (B-5) | | | | | | | 5 | | 30 | | | 2.5 |
| Cationic photopolymerization initiator (C) | (C-1) | 4 | 4 | 4 | | 4 | 4 | | | 4 | | | |
| | (C-2) | | | | 5 | | | | 5 | | | 4 | 5 |
| | (C-3) | | | | | | | 1 | | | | | |
| | (C-4) | | | | | | | | | | 1 | | |
| Epoxy group-containing silane compound (D) | (D-1) | 5 | 5 | 5 | 5 | 5 | | 5 | | 2 | 3 | 5 | 5 |
| | (D-2) | | | | | | 7 | | | | | | |
| Optimal dose of exposure [mJ/cm2] | | 150 | 150 | 150 | 150 | 200 | 250 | 100 | 150 | 150 | 2000 | 250 | 500 |
| Resolution [μm] | | 5 | 5 | 5 | 5 | 5.6 | 5.6 | 5 | 5 | 75 | 200< | 5 | 50 |
| Film crazing ※1 | | ◯ | ◯ | ◯ | ◯ | ◯ | ◯ | ◯ | X | X | X | X | X |
| Resistance to moisture and heat on adhesion ※2 | (Solution A) | ◯ | ◯ | ◯ | ◯ | ◯ | ◯ | ◯ | XX | ◯ | XX | X | X |
| | (Solution B) | ◯ | ◯ | ◯ | ◯ | ◯ | ◯ | ◯ | XX | ◯ | XX | X | X |
| | (Solution C) | ◯ | ◯ | ◯ | ◯ | ◯ | ◯ | ◯ | XX | ◯ | XX | X | X |

※1 ◯: No occurrence of cracks X: Occurrence of cracks
※2 ◯: No deterioration in adhesion force X: Occurrence of deterioration in adhesion force XX: Occurrence of detachment or peeling In Table 1, (A-1) to (D-2) represent the following materials, respectively.

(A-1): NC-6300H (trade name, made by Nippon Kayaku Co., Ltd.; epoxy resin (a); epoxy equivalents: 225 g/eq.)

(A-2): NER-7604 (trade name, made by Nippon Kayaku Co., Ltd.; epoxy resin (b); in Formula (2), $R_1$ and $R_2$ are each a hydrogen atom, with m is approximately 6; epoxy equivalents: 330 g/eq.)

(A-3): NER-7403 (trade name, made by Nippon Kayaku Co., Ltd.; epoxy resin (b); in Formula (2), $R_1$ and $R_2$ are each a hydrogen atom, with m is approximately 4; epoxy equivalents: 250 g/eq.)

(A-4): EPON SU-8 (trade name, made by Momentive Performance Materials Inc.; a bisphenol A novolac type epoxy resin; epoxy equivalents: 213 g/eq.)

(B-3): MILEX XLC (trade name, made by Mitsui Chemicals, Inc.; a polyhydric phenol compound represented by Formula (6), with $R_8$ and $R_9$ representing a hydrogen atom, and with y is approximately 3.2; softening point: 77° C.; hydroxyl equivalents: 176 g/eq.)

(B-4): KAYAHARD GPH-65 (trade name, made by Nippon Kayaku Co., Ltd.; a polyhydric phenol compound represented by Formula (5), with Z is approximately 1.5; softening point: 65° C.; hydroxyl equivalents: 200 g/eq.)

(B-5): MEP-6309E (trade name, made by Meiwa Plastic Industries, Ltd.; a polyhydric phenol compound represented by Formula (4), with q is approximately 5; softening point: 81° C.; hydroxyl equivalents: 116 g/eq.)

(C-1): SP-172 (trade name, made by ADEKA Corporation; a 50 wt % propylene carbonate solution; in the Table, the amounts blended are described in terms of solid content):

(C-2): CPI-6976 (trade name, made by ACETO Corporation, a 50 wt % propylene carbonate solution, in the Table, the amounts blended are described in terms of solid content):

(C-3): IRGACURE PAG290 (Trade name, made by BASF Corporation.)

(C-4): SP-170 (trade name, made by ADEKA Corporation; a 50 wt % propylene carbonate solution; in the Table, the amounts blended are described in terms of solid content.)

(D-1): 3-glycidoxypropyl trimethoxysilane (D-2): 3-glycidoxypropyl methyldimethoxysilane Example 8

Preparation of Resist Laminate Made from Photosensitive Resin Composition of the Present Invention Ethylene glycol dimethyl ether was further added to the blended composition of Example 1 shown in Table 1, which was mixed and dissolved by stirring in a flask having a stirrer at 60° C. for 1 hour, such that the solution had a viscosity of 3 Pa·s at 25° C. through the dilution. After cooling, membrane filtration with a pore size of 1.0 μm was conducted, so that a dry film lacquer of the photosensitive resin composition was obtained. The lacquer was uniformly applied to a base film (made of polypropylene manufactured by Mitsubishi Plastics, Inc.; film thickness: 38 μm), which was dried at 60° C. for 5 minutes and at 80° C. for 15 minutes using a hot-air convection dryer. A cover film (made of polypropylene manufactured by Mitsubishi Plastics, Inc.; film thickness: 38 μm) was then laminated onto the exposed surface, so that a resist laminate containing a sandwiched dry film resist having a thickness of 25 μm (i.e. a photosensitive resin composition laminate) was obtained.

Patterning of Dry Film Resist

After the cover film was detached from the produced resist laminate of the photosensitive resin composition, the resist laminate was laminated on a silicon wafer at a roll temperature of 70° C., under an air pressure of 0.2 MPa, at a rate of 0.5 m/min. Subsequently, the base film was detached to produce a 25 μm-thick photosensitive resin composition layer (i.e. a dry film resist). The photosensitive resin composition layer was subjected to contact exposure with an i-line exposure device (MASK ALIGNER made by Ushio Inc.). Subsequently, PEB was conducted for 5 minutes with a hot plate at 95° C. Subsequently, immersion development was conducted at 23° C. for 3 minutes with SU-8 DEVELOPER (trade name, made by MicroChem Corp., mainly composed of propylene glycol monomethyl ether acetate). After rinsing with isopropanol and drying, a resin pattern cured on the substrate was obtained. With an optimum dose of exposure of 150 mJ/cm$^2$, a cured product with a thin line tightly adhered pattern having a width of 5 μm and a vertical sidewall was obtained without residues and cracks.

INDUSTRIAL APPLICABILITY

The photosensitive resin composition of the present invention enables a fine pattern having a vertical sidewall profile to be formed by photolithography. The cured product has properties of low stress and excellent resistance to moisture and heat. The present invention can provide a permanent resist and a cured product having the properties required in the fields of semiconductors, MEMS/micromachine applications, particularly required for MEMS packages, semiconductor packages and components for forming microreactors.

The invention claimed is:

1. A photosensitive resin composition comprising: an epoxy resin (A), a polyhydric phenol compound (B), a cationic photopolymerization initiator (C), and an epoxy group-containing silane compound (D);
   wherein the epoxy resin (A) comprises an epoxy resin (a) obtained from reaction of a phenol derivative represented by the following Formula (1) and epihalohydrin:

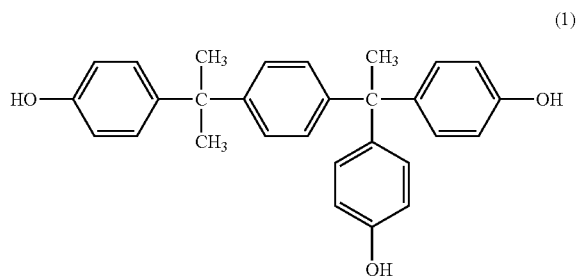

and an epoxy resin (b) represented by the following Formula (2):

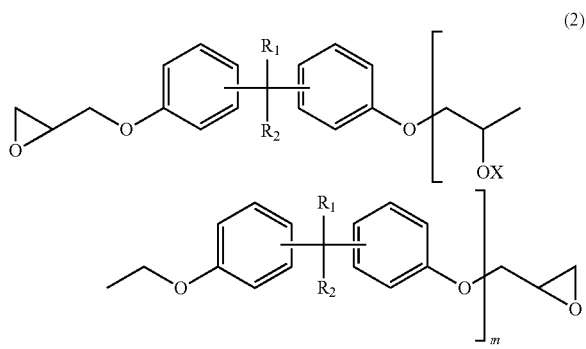

wherein m is an average value, representing a real number in the range from 2 to 30, $R_1$ and $R_2$ each independently represent a hydrogen atom, an alkyl group having 1 to 4 carbon atoms, or a trifluoromethyl group, each X independently represents a hydrogen atom or a glycidyl group, and at least one of a plurality of X present is a glycidyl group; and the polyhydric phenol compound (B) comprises one or more selected from the group consisting of phenol compounds represented by the following Formulas (3) to (6):

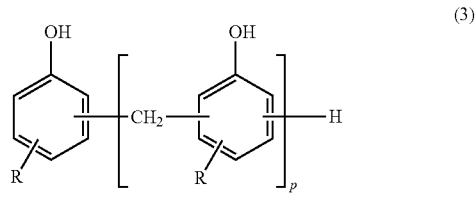

wherein p is an average value, representing a real number in the range from 1 to 10, and each R independently represents a hydrogen atom or an alkyl group having 1 to 4 carbon atoms;

(4)

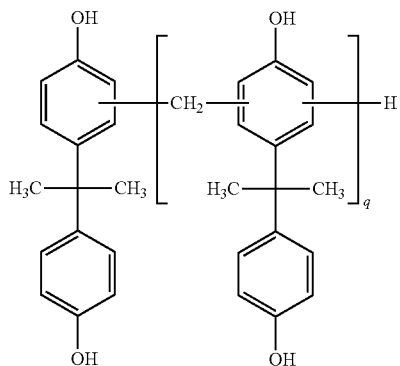

wherein q is an average value, representing a real number in the range from 1 to 10;

(5)

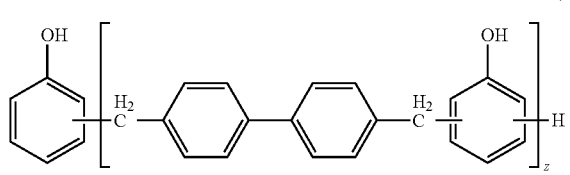

wherein z is an average value, representing a real number in the range from 1 to 10;

(6)

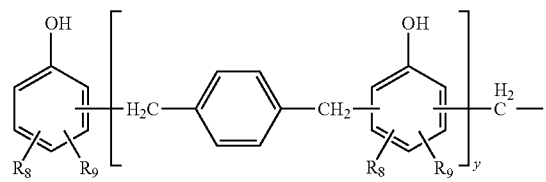

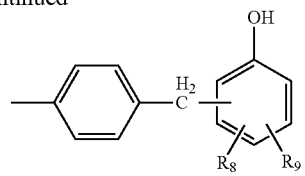

wherein y is an average value, representing a real number in the range from 1 to 10, and $R_8$ and $R_9$ each independently represent a hydrogen atom or an alkyl group having 1 to 4 carbon atoms, and wherein a blending ratio of the polyhydric phenol compound (B) is 1 to 40 mass % relative to a mass of the epoxy resin (A).

2. The photosensitive resin composition according to claim 1, wherein a blending ratio of the cationic photopolymerization initiator (C) is 0.1 to 15 mass % relative to a total mass of the epoxy resin (A) and the polyhydric phenol compound (B).

3. The photosensitive resin composition according to claim 1, wherein the epoxy group-containing silane compound (D) is an epoxy group-containing alkoxysilane compound.

4. The photosensitive resin composition according to claim 1, wherein a blending ratio of the epoxy group-containing silane compound (D) is 1 to 15 mass % relative to a total mass of the epoxy resin (A), the polyhydric phenol compound (B), and the cationic photopolymerization initiator (C).

5. The photosensitive resin composition according to claim 1, further comprising a solvent (E).

6. The photosensitive resin composition according to claim 5, wherein a blending ratio of the solvent (E) is 5 to 95 mass % relative to a total mass of the photosensitive resin composition including the solvent (E).

7. A cured product of the photosensitive resin composition according to claim 1.

8. A resist laminate comprising the photosensitive resin composition according claim 1 sandwiched between two substrates.

9. A cured product of a dry film resist formed from the resist laminate according to claim 8.

* * * * *